United States Patent [19]

Yamazaki

[11] Patent Number: 4,764,476
[45] Date of Patent: Aug. 16, 1988

[54] METHOD OF MAKING PHOTOELECTRIC CONVERSION DEVICE

[75] Inventor: Shunpei Yamazaki, Tokyo, Japan

[73] Assignee: Semiconductor Energy Laboratory Co., Ltd., Kanagawa, Japan

[21] Appl. No.: 51,287

[22] Filed: May 19, 1987

Related U.S. Application Data

[62] Division of Ser. No. 770,555, Aug. 29, 1985.

[30] Foreign Application Priority Data

Aug. 29, 1984 [JP]   Japan ................................ 59-181096
Aug. 29, 1984 [JP]   Japan ................................ 59-181097

[51] Int. Cl.[4] .......................................... H01L 31/04
[52] U.S. Cl. .......................................... 437/4; 437/51; 437/174; 437/205; 437/233; 437/247; 136/244; 136/258; 148/DIG. 90; 148/DIG. 93
[58] Field of Search ............... 437/4, 51, 174, 205, 437/225, 233, 247; 136/244, 258 AM; 148/DIG. 90, DIG. 93

[56] References Cited

FOREIGN PATENT DOCUMENTS 60-227484  11/1985  Japan ................................ 136/261

Primary Examiner—Aaron Weisstuch
Attorney, Agent, or Firm—Gerald J. Ferguson, Jr.

[57] ABSTRACT

A method of making a photoelectric conversion device with a substrate having an insulating surface, and a plurality n of non-single crystal semiconductor photoelectric conversion elements $U_1$ to $U_n$ sequentially formed side by side on the substrate and connected in series one after another, which eliminates leakage between electrodes and attains a high photoelectric conversion efficiency. The active portion of each element $U_1$ to $U_n$ is selectively annealed by light irradiation to increase its crystallinity, hence conductivity. The inter-cell coupling portion has a high resistance to current leakage.

1 Claim, 5 Drawing Sheets 4,764,476

METHOD OF MAKING PHOTOELECTRIC CONVERSION DEVICE

This is a division of application Ser. No. 770,555, filed 8/29/85.

BACKGROUND OF THE INVENTION

1. Field of the Invention

The present invention relates to improvement in or relating to a photoelectric conversion device in which a plurality of semiconductor photoelectric conversion elements are sequentially arranged on a substrate in side-by-side relation and are connected in series.

The invention also pertains to a method for the manufacture of such a photoelectric conversion device.

2. Description of the Prior Art

Heretofore there has been proposed a photoelectric conversion device of the type wherein a plurality n (n being an integer greater than one) of semiconductor photoelectric conversion elements $U_1$ to $U_n$ are sequentially formed side by side on a substrate having an insulating surface and are connected in series one after another.

According to this semiconductor photoelectric conversion device, the semiconductor photoelectric conversion element $U_i$ ($i=1, 2, \ldots n$) has a first electrode $E_i$ formed on the substrate, a non-single-crystal semiconductor laminate member $Q_i$ formed on the first electrode $E_i$ and a second electrode $F_i$ formed on the non-single-crystal semiconductor laminate member $Q_i$. The non-single-crystal semiconductor laminate member $Q_i$ has at least a first non-single-crystal semiconductor layer having a P or N conductivity type, a second non-single-crystal semiconductor layer having an I conductivity and a third non-single-crystal semiconductor layer having opposite conductivity type to the first non-single-crystal semiconductor layer. The first electrodes $E_j$ ($j=1, 2, \ldots (n-1)$) and $E_{j+1}$ are separated by a first groove $G_j$. The non-single-crystal semiconductor laminate member $Q_{j+1}$ extends to the non-single-crystal semiconductor laminate member $Q_j$ and down to the substrate in the groove $G_j$. The second electrode $F_{j+1}$ extends on the extending portion $Q'_{j+1}$ of the non-single-crystal semiconductor laminate member $Q_{j+1}$ and the non-single-crystal semiconductor laminate member $Q_j$. The second electrodes $F_j$ and $F_{j+1}$ are separated by an isolating portion $H_j$ opposite the first electrode $E_j$. The non-single-crystal semiconductor laminate member $Q_j$ has a second groove $O_j$ extending between the first electrode $E_j$ and the second electrode $F_{j+1}$. The second electrode $F_{j+1}$ is coupled with the first electrode $E_j$ through a coupling portion $K_j$ formed by an extension of the second electrode $F_{j+1}$ and extending into the second groove $O_j$.

In such a photoelectric conversion device, leakage is likely to develop between the first electrodes $E_j$ and $E_{j+1}$ across the extending portion $Q_{j+1}'$ of the non-single-crystal semiconductor laminate member $Q_{j+1}'$ of and between the second electrodes $F_j$ and $F_{j+1}$ across the region of the non-single-crystal semiconductor laminate member $Q_j$ underlying the isolating portion $H_j$.

The leakage between the first electrodes $E_j$ and $E_{j+1}$ leads to a short circuit between the first electrode $E_{j+1}$ and the second electrode $F_{j+1}$ across the coupling portion $K_j$, and the leakage between the second electrodes $F_j$ and $F_{j+1}$ also leads to a short circuit between the first electrode $E_j$ and the second electrode $F_j$ across the coupling portion $K_j$.

It is therefore impossible with the above conventional photoelectric conversion device to obtain a predetermined high voltage corresponding to the number n of photoelectric elements $U_1$ to $U_n$.

Furthermore, in the abovesaid conventional photoelectric conversion device, since a carrier depletion layer is not formed on the second non-single-crystal semiconductor layer of the laminate member $Q_i$ throughout it, all carriers which are created in the I-type second non-single-crystal semiconductor layer by the incidence of light on the laminate member $Q_i$ cannot effectively be field drifted to the P-type and/or N-type layer. Accordingly, the conventional photoelectric conversion device is relatively low in photoelectric conversion efficiency.

SUMMARY OF THE INVENTION

It is therefore an object of the present invention to provide a novel photoelectric conversion device which is free from the abovesaid defects.

Another object of the present invention is to provide a method for the manufacture of the abovesaid photoelectric conversion device.

In accordance with an aspect of the present invention, as is the case with the photoelectric conversion device mentioned above, a plurality n of semiconductor elements $U_1$ to $U_n$ are formed on a substrate having an insulating surface, and the semiconductor element $U_i$ ($i=1, 2, \ldots n$) has a first electrode $E_i$ formed on the substrate, a non-single-crystal semiconductor laminate member $Q_i$ formed on the first electrode $E_i$ and a second electrode $F_i$ formed on the non-single-crystal semiconductor laminate member $Q_i$. The non-single-crystal semiconductor laminate member $Q_i$ has at least a first non-single-crystal semiconductor layer having a P or N conductivity type, a second non-single-crystal semiconductor layer having an I conductivity and a third non-single-crystal semiconductor layer having opposite conductivity type to the first non-single-crystal semiconductor layer. The first electrodes $E_j$ ($j=1, 2, \ldots (n-1)$) and $E_{j+1}$ are separated by a first groove $G_j$. The non-single-crystal semiconductor laminate member $Q_{j+1}$ extends to the non-single-crystal semiconductor laminate member $Q_j$ and down to the substrate in the groove $G_j$. The second electrode $F_{j+1}$ extends on the extending portion $Q'_{j+1}$ of the non-single-crystal semiconductor laminate member $Q_{j+1}$ and the non-single-crystal semiconductor laminate member $Q_j$. The second electrodes $F_j$ and $F_{j+1}$ are separated by an isolating portion $H_j$ opposite the first electrode $E_j$. The non-single-crystal semiconductor laminate member $Q_j$ has a second groove $O_j$ extending between the first electrode $E_j$ and the second electrode $F_{j+1}$. The second electrode $F_{j+1}$ is coupled with the first electrode $E_j$ through a coupling portion $K_j$ formed as an extension of the second electrode $F_{j+1}$ and extending into the second groove $O_j$.

According to the present invention, however, at least the second non-single-crystal semiconductor layer of the non-single-crystal semiconductor laminate member $Q_j$ has a region between the first electrode $E_j$ and the second electrode $F_j$, where the first region having a conductivity higher than the second non-single-crystal semiconductor layer of the extending portion $Q'_j$ of the non-single-crystal semiconductor laminate member $Q_j$ and the region of the second non-single-crystal semiconductor layer of the non-single-crystal semiconductor laminate member $Q_j$ underlying the isolating portion $H_j$.

According to the photoelectric conversion device of the present invention, the region of the second non-single-crystal semiconductor layer of the non-single-crystal semiconductor laminate member $Q_j$ has a higer conductivity than at least the second non-single-crystal semiconductor layer of the extending portion $Q_j'$ of the non-single-crystal semiconductor laminate member $Q_j$ and the region of the second non-single-crystal semiconductor layer of the non-single-crystal semiconductor laminate member $Q_j$ underlying the isolating portion $H_j$. This means that the extending portion $Q_j'$ of the non-single-crystal semiconductor laminate member $Q_j$ and the region of the second non-single-crystal semiconductor layer of the non-single-crystal semiconductor laminate member $Q_j$ underlying the isolating portion $H_j$ have a high resistance. On account of this, no leakage occurs between the first electrodes $E_i$ and $E_{j+1}$ across the extending portion $Q_{j+1}'$ and between the second electrodes $F_j$ and $F_{j+1}$ across the region of the non-single-crystal semiconductor laminate member $Q_j$ underlying the isolating portion $H_j$, and even if leakage develops, it is negligibly small. Accordingly, there are substantially no possibilities of causing a short circuit between the first and second electrode $E_{j+1}$ and $F_{j+1}$ across the coupling portion $K_j$ and between the first and second electrodes $E_j$ and $F_j$ across the coupling portion $K_j$.

Furthermore, according to the photoelectric conversion device of the present invention, since the region of the second non-single-crystal semiconductor layer of the non-single-crystal semiconductor laminate member $Q_j$ has a high conductivity, a carrier depletion layer can be formed throughout the I-type second semiconductor layer of the laminate member $Q_i$. This permits effective utilization of all carriers which are created in the I-type layer by the incidence of light on the laminate member $Q_i$.

Accordingly, with the photoelectric conversion device of the present invention, it is possible to obtain a larger photo current than is obtainable with the prior art photoelectric conversion devices, and the photoelectric conversion device of the present invention is relatively high in photoelectric conversion efficiency.

According to the manufacturing method of the present invention, the above-mentioned photoelectric conversion device of the present invention is fabricated through the following sequential steps.

The manufacture starts with the formation of a first conductive layer on the abovesaid substrate. The first conductive layer will ultimately form the first electrodes $E_1$ to $E_n$.

Next, the first conductive layer is exposed to a laser beam to cut therein $(n-1)$ first grooves $G_1$ to $G_{n-1}$ which are sequentially arranged, providing the first electrodes $E_1$ to $E_n$ individually separated by the first grooves $G_1$ to $G_{n1}$.

Next, a non-single-crystal semiconductor laminate member, which will ultimately form the non-single-crystal semiconductor laminate members $Q_1$ to $Q_n$, is formed on the substrate, filling the first grooves $G_1$ to $G_{n-1}$ and covering the first electrodes $E_1$ to $E_n$.

Next, the non-single-crystal semiconductor laminate member is exposed to a laser beam to cut therein $(n-1)$ sequentially arranged second grooves $O_1$ to $O_{n-1}$. As a result of this, the non-single-crystal semiconductor laminate members $Q_1$ to $Q_n$ are formed which extend on the first electrodes $E_1$ to $E_n$, respectively, and the first electrodes $E_1$ to $E_{n-1}$ are exposed to the outside through the grooves $O_1$ to $O_{n-1}$, respectively, where the semiconductor laminate member $Q_{j+1}$ extends to the non-single-crystal semiconductor laminate member $Q_j$ and down to the substrate 1 in the second groove $O_j$.

Next, a second conductive layer which will ultimately form the second electrodes $F_1$ to $F_n$, is formed which continuously extends on the non-single-crystal semiconductor laminate members $Q_1$ to $Q_n$ and into the second grooves $O_1$ to $O_{n-1}$, providing coupling portions $K_1$ to $K_{n-1}$ which are connected to the first electrodes $E_1$ to $E_{n-1}$ through the second grooves $O_1$ to $O_{n-1}$, respectively.

Next, $(n-1)$ sequentially arranged isolating portions $H_1$ to $H_{n-1}$ are formed in at least the second conductive layer, providing n sequentially arranged second electrodes $F_1$ to $F_n$ which are separated by the isolating portions $H_1$ to $H_{n-1}$ and are opposite therethrough the first electrodes $E_1$ to $E_{n-1}$, respectively. The second electrode $F_{j+1}$ is connected to the first electrode $E_j$ through the coupling portion $K_j$.

Before or after the above step, a portion of the second non-single-crystal semiconductor layer of the non-single-crystal semiconductor laminate member $Q_i$ which is sandwiched between the first electrode $E_i$ and the second electrode $F_i$ is subjected to annealing by light having a wavelength greater than 500 nm so as to increase the conductivity of that portion.

In this way, the photoelectric conversion device of the present invention is manufactured.

Such a manufacturing method of the present invention permits easy fabrication of the photoelectric conversion device of the present invention which possesses the aforementioned excellent features.

Other objects, features and advantages of the present invention will become more fully apparent from the following detailed description taken in conjunction with the accompanying drawings.

DESCRIPTION OF THE PREFERRED EMBODIMENTS

A description will be given first, with reference to FIGS. 1 to 3, of a photoelectric conversion device of an embodiment of the present invention.

Figure 1:
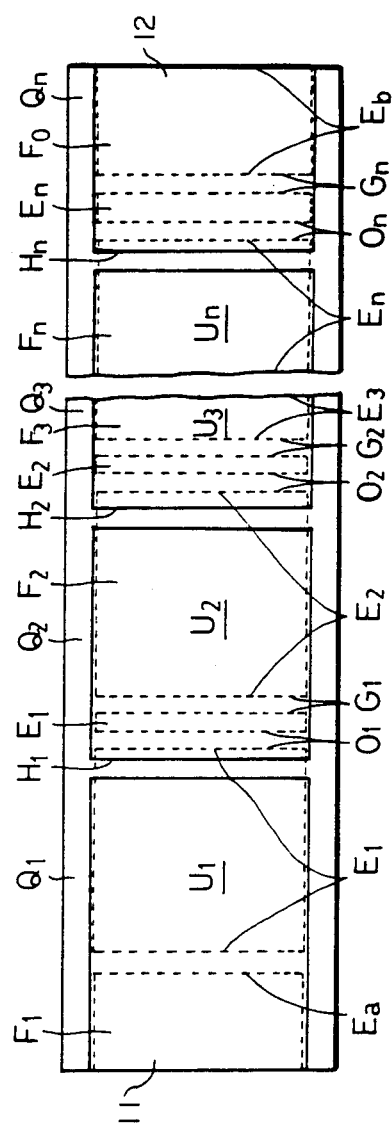
FIG. 1 is a plan view schematically illustrating the photoelectric conversion device of an embodiment of the present invention.
Figure 2:
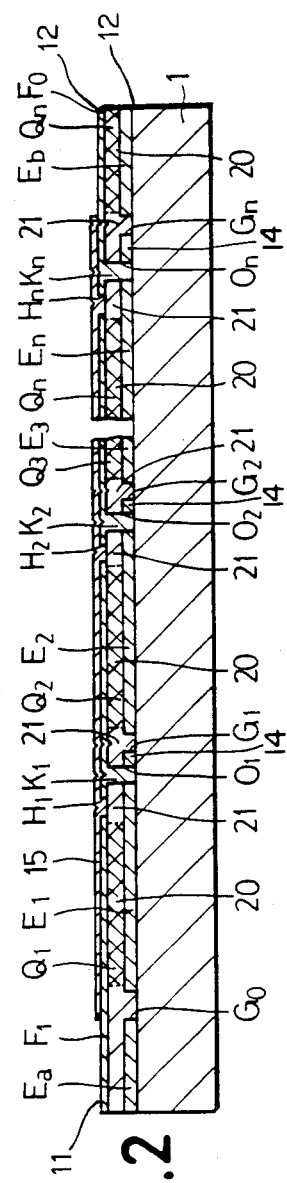
FIG. 2 is a schematic sectional view taken on the line II—II in FIG. 1.
Figure 3:
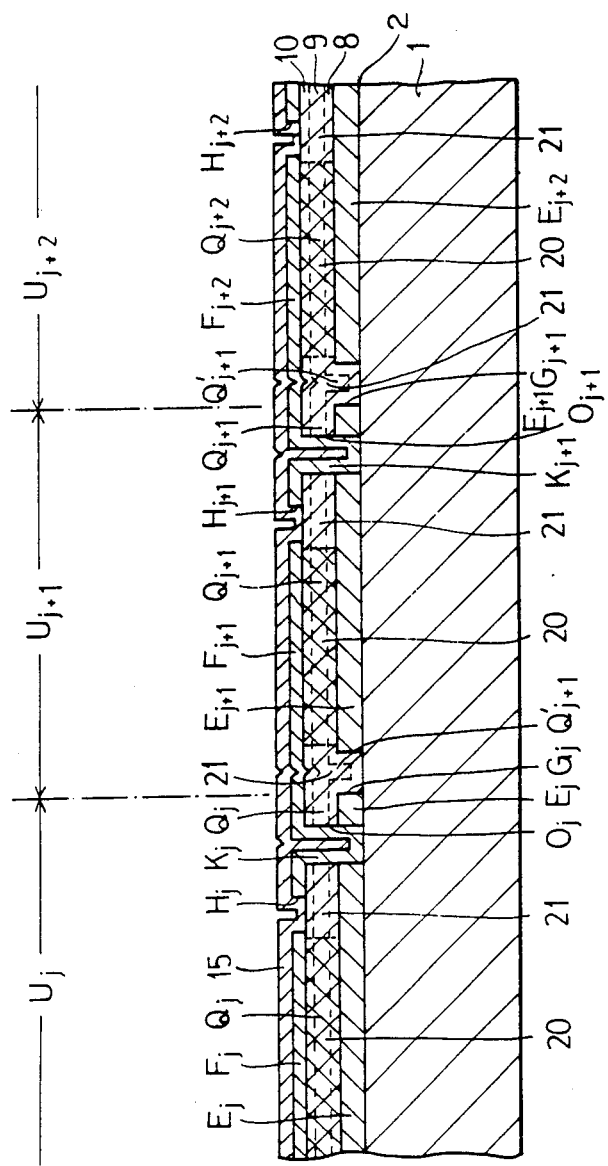
FIG. 3 is a detailed cross-sectional view showing on an enlarged scale parts of the embodiment of the present invention shown in FIG. 2.

The embodiment of the photoelectric conversion device of the present invention shown in FIGS. 1 to 3 has a plurality n (n being an integer larger than one) of photoelectric conversion elements $U_1$ to $U_n$ formed side by side on a substrate 1.

The substrate 1 has an insulating surface 2.

The substrate 1 may be a light-transparent substrate made of glass, organic synthetic resin or the like, or a flexible sheet as of organic synthetic resin. It is also possible to employ a non-light-transparent substrate of ceramics, organic resin or the like, a non-light-transparent metal substrate having its surface insulated, or a flexible, insulating sheet-like member having an insulating film, for example, a 5 $\mu$m thick polyimide resin film, formed on the surface of a flexible metallic sheet, for example, a stainless steel foil about 100 $\mu$m thick.

The substrate 1 is, for example, rectangular in shape and 10 cm wide and 10 cm long.

The photoelectric conversion element $U_i$ ($i=1, 2, 3, \ldots n$) on the substrate 1 has an electrode $E_i$ formed on the substrate 1, a non-single-crystal semiconductor laminate member $Q_i$ formed on the electrode $E_i$ and an electrode $F_i$ formed on the non-single-crystal semiconductor laminate member $Q_i$ in opposing relation to the electrode $E_i$.

The electrode $E_i$ is, for example, rectangular in shape and has a thickness of 0.1 to 0.5 $\mu$m.

Electrodes $E_j$ ($j=1, 2, \ldots (n-1)$) and $E_{j+1}$ are separated by a groove $G_j$. The groove $G_j$ is, for example, 40 $\mu$m wide.

The electrode $E_i$ may be a single-layer structure, or a two-layer structure which comprises a layer making contact with the substrate 1 and a layer formed on the layer in contact with the non-single-crystal semiconductor laminate member $Q_i$.

The electrode $E_i$ may be a reflective electrode when the electrode $F_i$ is light-transparent. When the electrode $E_i$ is a reflective electrode, light incident on the non-single-crystal semiconductor laminate member $Q_i$ on the opposite side from the substrate 1 passes through the non-single-crystal semiconductor laminate member $Q_i$, then is reflected by the surface of the electrode $E_i$ back to the non-single-crystal semiconductor laminate member $Q_i$ to pass therethrough. The larger the optical path length of the reflected light in the non-single-crystal semiconductor laminate member $Q_i$ is, the more the utilization efficiency of light is raised. From this point of view, it is preferable that the surface of the electrode $E_i$ on the side of the non-single-crystal semiconductor laminate member $Q_i$ have irregularities oblique to planes perpendicular to the substrate surface to form a diffuse reflection surface at the boundary between it and the non-single-crystal semiconductor laminate member $Q_i$.

In the case where the electrode $E_i$ is reflective and has the single-layer structure, it may be a reflective conductive layer. In this case, the layer may be one that is formed of aluminum or silicon, or consisting principally thereof.

In the case where the electrode $E_i$ is a reflective electrode and has the two-layer structure, in order to simultaneously satisfy the requirements that the electrode $E_i$ be of high conductivity and high reflectivity and to prevent that when the non-single-crystal semiconductor laminate member $Q_i$ is formed, the material of its non-single-crystal semiconductor layer on the side of the electrode $E_i$ or an impurity contained therein reacts with the material of the reflective electrode to form a layer of high contact resistance in the interface between the electrode $E_i$ and the non-single-crystal semiconductor laminate member $Q_i$, it is preferable that the layer making contact with the substrate 1 be a reflective conductive layer and that the layer making contact with the non-single-crystal semiconductor layer $Q_i$ be a light trans-parent metal oxide layer. In the case where the layer making contact with substrate 1 is the reflective conductive layer, it may preferably be made of metal. The metal may be stainless steel but, in view of the requirements of high conductivity and high reflectivity for the electrode $E_i$, it is preferable to employ aluminum (Al), silver (Ag), an aluminum-base alloy containing, for example, 0.1 to 2 volume % of silicon, or a silver-base alloy. When the layer making contact the non-single-crystal semiconductor laminate member $Q_i$ is a light-transparent metal oxide layer, in order to ensure that the layer be high in conductivity and in transmittance and to prevent that when the non-single-crystal semiconductor laminate member $Q_i$ is formed, the metallic oxide reacts with the material or impurity of the non-single-crystal semiconductor layer of the laminate member $Q_i$ on the side of the electrode $E_i$ to form the abovesaid high contact resistance layer, it is preferable to form the layer making contact with the non-single-crystal semiconductor laminate member $Q_i$ of a tin oxide ($SnO_2$ or $SnO$) or a metallic oxide consisting principally of such a tin oxide, for instance, a tin oxide containing halogen or, 1 to 10 wt % of antimony oxide in the event that the non-single-crystal semiconductor layer of the non-single-crystal semiconductor laminate member $Q_i$ on the side of the electrode $E_i$ is p-type. In the case where the layer of the non-single-crystal semiconductor laminate member $Q_i$ on the side of the electrode $E_i$ is N-type, it is preferable to use an indium oxide or a metallic oxide consisting principally of thereof, for instance, an indium oxide containing 1 to 10 wt % of tin oxide. In this case, the light transparent conductive layer is 300 to 600 Å thick.

In the case where the electrode $E_i$ is such a two-layer reflective electrode, when the abovesaid diffuse reflection surface is formed at the boundary between the electrode $E_i$ and the non-single-crystal semiconductor laminate member $Q_i$, it is formed on the surface of the layer making contact with the non-single-crystal semiconductor laminate member $Q_i$ on the side of the laminate member $Q_i$.

In the case where the electrode $E_i$ is comprised of two layers, these layers are a reflective conductive layer and a light-transparent conductive layer to form a reflective electrode, the surface of the reflective layer may also be formed as the diffuse reflection surface in the interface between it and the light-transparent conductive layer.

When the substrate 1 is light-transparent, the electrode $E_i$ is formed as a light-transparent electrode. In such a case, the light-transparent electrode may be a metal oxide layer.

Where the electrode $E_i$ is a light-transparent single layer electrode, when the non-single-crystal semiconductor layer of the non-single-crystal laminate member $Q_i$ on the side of the electrode $E_i$ is P-type, the electrode $E_i$ may preferably be of a tin oxide or a metallic oxide consisting principally thereof for the same reasons as given previously. When the abovesaid non-single-crystal semiconductor layer is N-type, the electrode $E_i$ may preferably be a metal oxide layer formed of an indium oxide or consisting principally thereof.

In the case where the electrode $E_i$ has the two-layer structure and is light-transparent, if the non-single-crystal semiconductor layer of the non-single-crystal semiconductor laminate member $Q_i$ on the side of the electrode $E_i$ is P-type, it is preferable that the layer making contact with the non-single-crystal semiconductor laminate member $Q_i$ be a metal oxide layer formed of a tin oxide or a metallic oxide consisting principally thereof and that the layer making contact with the substrate 1 be a metal oxide layer formed of an indium oxide or a metallic oxide consisting principally thereof.

When the electrode $F_i$ is light-transparent, the electrode $E_i$ need not always be reflective. In this case, if the electrode $E_i$ is a single-layer, it may be a layer formed of chromium or a material consisting principally thereof. Moreover, in the case of the two-layer structure, the layer making contact with the substrate 1 may be the abovesaid metal oxide layer and the layer making contact with the non-single-crystal semiconductor laminate member $Q_i$ may be a layer formed of chromium or a material consisting principally thereof.

In the photoelectric conversion element $U_i$ formed on the substrate 1, the non-single-crystal semiconductor laminate member $Q_{j+1}$ (j=1, 2, ... (n−1)) on the aforesaid electrode $E_{j+1}$ extends laterally to the non-single-crystal semiconductor laminate member $Q_j$ and down to the substrate 1 in the groove $G_j$ separating the electrode $E_j$ and $E_{j+1}$.

As shown in FIGS. 1 and 2, an electrode $E_a$ similar to the elctrodes $E_1$ to $E_n$ is formed on the substrate 1 on the side of the electrode $E_1$ of the element $U_1$ on the opposite side from the electrode $E_1$ and the electrode $E_a$ is separated by a groove $G_0$ similar to those $G_1$ to $G_{n-1}$.

Further, the non-single-crystal semiconductor laminate member $Q_1$ of the element $U_1$ extends laterally to the marginal edge of the electrode $E_a$ on the opposite side from the electrode $E_1$ and down to the substrate 1 in the groove $G_0$.

Moreover, as shown in FIGS. 1 and 2, an electrode $E_b$ similar to the electrode $E_1$ to $E_n$ is formed on the substrate 1 on the side of the electrode $E_n$ of the element $U_n$ on the opposite side from the electrode $E_{n-1}$ and the electrode $E_b$ is separated by a groove $G_n$ similar to those $G_1$ to $G_{n-1}$.

Further, laminate member $Q_n$ laterally extends to the marginal edge of the electrode $E_b$ on the opposite side from the electrode $E_n$ and down to the substrate 1 in the groove $G_n$.

The non-single-crystal semiconductor laminate member $Q_i$ is formed to vertically extend to cover the electrode $E_i$. The non-single-crystal semiconductor laminate member $Q_i$ has cut therein a groove $O_i$ which is shown to extend in the vertical direction in FIG. 1. The grooves $O_1$ to $O_n$ are formed simultaneously.

The non-single-crystal semiconductor laminate member $Q_i$ may preferably be formed by one or more three-layer structures, each composed of a P-type or N-type non-single-crystal semiconductor layer 8, an I-type non-single-crystal semiconductor layer 9 and a non-single-crystal semiconductor layer 10 opposite in conductivity type to the layer 8 as shown in FIG. 3. Accordingly, the non-single-crystal semiconductor laminate member $Q_i$ may preferably be formed to have at least one PIN junction.

The non-single-crystal semiconductor layer of the non-single-crystal semiconductor laminate member $Q_i$ on the side of the electrode $E_i$ is P-type when the layer of the electrode $E_i$ making contact with the non-single-crystal semiconductor laminate member $Q_i$ is formed by a tin oxide or metallic oxide consisting principally thereof as described previously. When the layer of the electrode $E_i$ making contact with the non-single-crystal semiconductor laminate member $Q_i$ is formed by an indium oxide or metallic oxide consisting principally thereof, the non-single-crystal semiconductor layers 8 of the non-single-crystal semiconductor laminate member $Q_i$ on the side of the electrode $E_i$ is N-type.

Accordingly, in the case where the non-single-crystal semiconductor laminate member $Q_i$ has the three-layer structure comprising the non-single-crystal semiconductor layers 8, 9, and 10 as illustrated in FIG. 3 and the layer of the electrode $E_i$ making contact with the semiconductor laminate member $Q_i$ is transparent and is formed by the tin oxide or metallic oxide consisting principally thereof, the non-single-crystal semiconductor layers 8 and 10 are P-type and N-type, respectively. When the layer making contact with semiconductor laminate member $Q_i$ is transparent and is formed by the indium oxide or metal oxide consisting principally thereof, the non-single-crystal semiconductor layers 8 and 10 are N-type and P-type, respectively.

The non-single-crystal semiconductor layers making up the non-single-crystal semiconductor laminate member $Q_i$ may preferably be formed of silicon or a semiconductor consisting principally thereof silicon but may also be formed of other semiconductors.

When the non-single-crystal semiconductor laminate member $Q_i$ has the three-layer structure composed of the non-single-crystal semiconductor layers 8, 9, and 10, the non-single-crystal semiconductor layer 8 may be formed, for instance, of silicon to a thickness of 5 to 300 Å, preferably 70 to 130 Å. But in the case where the non-single-crystal semiconductor layer 8 is disposed on the side where the light to be converted is incident on the photoelectric conversion element $U_i$, it may preferably be formed of a semiconductor which has a larger band gap energy than does the semiconductor material of the non-single-crystal semiconductor layer 10, such as, for example, silicon carbide expressed by $Si_xC_{1-x}$ ($0<x<1$). Where the non-single-crystal semiconductor layer 8 is P-type, for example, boron (B) may be introduced thereinto as a P-type impurity.

The non-single-crystal semiconductor layer 9 can be formed of silicon as is the case with the non-single-crystal semiconductor layer 8 but its thickness may preferably be larger than that of the layer 8, for instance, 0.3 to 3.0 μm. The non-single-crystal semiconductor layer 9 contains a very small amount of a P-type impurity or does not substantially contain either of P-type and N-type impurities and, if any, their concentrations are negligibly low.

The non-single-crystal semiconductor layer 10 can also be formed of silicon as is the case with the non-single-crystal semiconductor layer 8. In the case, however, where the non-single-crystal semiconductor layer 10 is disposed on the side where the light to be converted is incident on the photoelectric conversion element, it may preferably be formed of a semiconductor which has a larger band gap energy than does the semiconductor material of the non-single-crystal semiconductor layer 8, such as, for example, silicon carbide expressed by $Si_xC_{1-x}$ ($0<x<1$). In this case, the non-single-crystal semiconductor layer 10 can be formed to a thickness of 5 to 300 Å, typically, in the range of 7 to 130 Å.

In the semiconductor element $U_i$ formed on the substrate 1, the electrode $F_i$ on the non-single-crystal semiconductor laminate member $Q_i$ is disposed opposite to the electrode $E_i$ formed on the non-single-crystal semiconductor laminate member $Q_i$.

In this case, the electrode $F_{j+1}$ extends on the extending portion $Q_{j+1}40$ of the non-single-crystal semiconductor laminate member $Q_{j+1}$ and the non-single-crystal semiconductor laminate member $Q_j$.

The electrode $F_1$ extends on the non-single-crystal laminate member $Q_1$ to the marginal edge of the nonsingle-crystal laminate member $Q_1$ on the side opposite from the non-single-crystal semiconductor laminate member $Q_2$.

On the non-single-crystal semiconductor laminate member $Q_n$, an electrode $F_0$ similar to the electrode $F_n$ is formed on the non-single-crystal semiconductor laminate member $Q_0$ to the marginal edge of the non-single-crystal semiconductor laminate member $Q_0$ opposite from the non-single-crystal semiconductor laminate member $Q_{n-1}$.

The electrodes $F_j$ and $F_{j+1}$ are isolated by an isolating portion $H_j$. The electrodes $F_{j+1}$ and $F_0$ are also isolated by an isolating portion $H_n$. The isolating portions $H_i$ and $H_n$ may be simultaneously formed as grooves as is the case with the grooves $G_i$.

The electrode $F_i$ may be formed as a single layer and may also be of the two-layer structure comprised of a layer making contact with the non-single-crystal semiconductor laminate member $Q_i$ and a layer formed on the layer.

The electrode $F_i$ may be a transparent conductive layer. When the electrode $F_i$ is a transparent single layer, it may be formed of a metallic oxide. In this case, it is required that the metal oxide be high in conductivity and in transmittance and, when forming the electrode $F_i$, would not react with the material or impurity of the non-single-crystal semiconductor layer of the non-single-crystal semiconductor laminate member $Q_i$ on the side of the electrode $F_i$ to form a layer which increases the contact resistance between the non-single-crystal semiconductor laminate member $Q_i$ and the electrode $F_i$ or a layer of low transmittance. To meet such requirements, when the non-single-crystal layer of the non-single-crystal semiconductor laminate member $Q_i$ on the side of the electrode $F_i$ is N-type, the electrode $F_i$ may preferably be formed of an indium oxide or metallic oxide consisting principally thereof, such as, for example, an indium oxide containing 1 to 10 wt % of tin oxide. When the non-single-crystal layer of the non-single-crystal semiconductor to laminate layer $Q_i$ on the side of the electrode $F_i$ is P-type, the electrode $F_i$ may preferably be formed of a tin oxide or metallic oxide consisting principally thereof. The electrode $F_i$ can be formed, for instance, 300 to 600 Å thick.

In the case where the electrode $E_i$ is transparent and has the two-layer structure, the layer making contact with the non-single-crystal semiconductor laminate member $Q_i$ may preferably be a layer formed of the tin oxide or consisting principally thereof, or a layer formed of the indium oxide or consisting principally thereof as described previously depending on whether the non-single-crystal semiconductor layer of the non-single-crystal semiconductor laminate member $Q_i$ is P-type or N-type. In this case, it is preferable that when the layer making contact with the non-single-crystal semiconductor laminate member $Q_i$ is formed of the tin oxide or consisting principally thereof, the other layer is formed of the indium oxide or consists principally thereof and, when the former layer is the layer formed of the indium oxide or consists principally thereof, the latter layer may be formed of the tin oxide or consisting principally thereof.

The electrode $F_i$ may be a relfective one when the substrate 1 and the electrode $E_i$ are light-transparent. When the electrode $F_i$ is the reflective electrode, it is possible to employ the two-layer structure.

Where the electrode $F_i$ has the two-layer structure, it is preferred that depending on whether the non-single-crystal semiconductor layer of the non-single-crystal semiconductor laminate member $Q_i$ on the side of the electrode $F_i$ is P-type or N-type, the layer making contact with the non-single-crystal semiconductor laminate member $Q_i$ is formed of the tin oxide or consists principally thereof, or the indium oxide or consists principally thereof, and the other layer be a reflective conductive layer as of silver or aluminum, as described previously.

The electrode $F_i$ need not always be reflective even if the substrate 1 and the electrode $E_i$ are light-transparent. In such a case, if the electrode has the two-layer structure, it is preferred that the layer making contact with the non-single-crystal semiconductor laminate member $Q_i$ is formed of the tin or indium oxide as mentioned above and the other layer is formed of a sublimable conductive layer formed of chromium or consisting principally thereof.

The electrode $F_0$ extending on the non-single-crystal semiconductor laminate member $Q_n$ has the same structure as the abovesaid electrode $F_i$.

The electrode $F_{j+1}$ of the semiconductor element $U_{j+1}$ (j=1, 2, ... (n−1)) is coupled with the electrode $E_j$ of the semiconductor element $U_j$ through a coupling portion $K_j$.

The coupling portion $K_j$ extends from the position where the electrode $F_{j+1}$ is opposite to the electrode $E_{j+1}$ to the region of the electrode $E_j$ opposite to the electrode $F_{j+1}$, passing through a groove $O_j$. Such a coupling portion $K_j$ is formed by an extension of the electrode $F_{j+1}$ formed simultaneously with the electrode $F_{j+1}$.

The electrode $F_1$ of the semiconductor element $U_1$ constitutes an external connection terminal 11.

The electrode $F_0$ extending on the non-single-crystal semiconductor laminate member $Q_n$ is coupled with the electrode $E_n$ of the semiconductor element $U_n$ through a coupling portion $K_n$. In this case, the coupling portion $K_n$ extends from the position where the electrode $F_0$ is opposite to the electrode $E_b$ to the region of the electrode $E_n$ opposite to the electrode $F_0$, passing through a groove $O_n$. Such a coupling portion $K_n$ is an extension of the electrode $F_0$ formed simultaneously therewith. Electrode $F_0$ extends on the non-single-crystal semiconductor laminate member $Q_n$ in the direction away from the electrode $F_n$ to the marginal edge of the member $Q_n$ and the extending end portion forms a terminal 12 for external connection.

The isolating portion $H_i$ is formed to extend in the vertical direction in FIG. 1 to the non-single-crystal semiconductor laminate member $Q_j$.

The isolating portion $H_i$ may be formed to extend into the non-single-crystal semiconductor laminate member $Q_i$.

On the substrate 1 is formed a transparent antireflection and protective film 15 to cover the aforesaid semiconductors $U_1$ to $U_n$. In this case, however, the antireflection and protective film 15 does not extend on the extended portions of the electrodes $F_1$ and $F_0$ forming the aforementioned external connection terminals 11 and 12, respectively.

In the photoelectric conversion element $U_i$ formed on the substrate 1, the non-single-crystal semiconductor laminate member $Q_i$ has formed therein an active portion indicated in FIG. 2 by double hatching and reference numeral 20 in the region sandwiched between the first and second electrodes $E_i$ and $F_i$. The portion 20 has a higher conductivity than does the other portion identified by 21, and is formed of a microcrystalline or polycrystalline semiconductor when the part 21 is formed of a semi-amorphous semiconductor. Moreover, when the part 21 is formed of a microcrystalline or polycrystalline semiconductor, the portion 20 is formed of a microcrystalline or polycrystalline semiconductor of a larger grain size.

While it has been described above that the portion 20 of the laminate member $Q_j$, and consequently, the portion of the layers 8, 9, and 10 of the laminate member $Q_j$ in the region between the electrodes $E_i$ and $F_i$ has a higher conductivity than the other portions, only the portion of the I-type layer 9 in the region between the electrodes $E_i$ and $F_i$ may be formed to have a higher conductivity than the other regions and the P and N type layers 8 and 10.

The foregoing is a description of the arrangement of an embodiment of the photoelectric conversion device according to the present invention.

Next, a description will be given, with reference to FIGS. 4A to 4H, of an embodiment of the photoelectric conversion device manufacturing method of the present invention.

In FIGS. 4A to 4G, parts corresponding to those in FIGS. 1 to 3 are identified by the same reference numerals and characters and no detailed description thereof will be repeated.

Figure 4A:
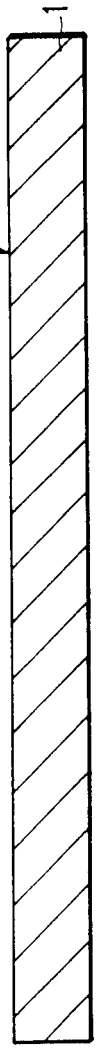
FIGS. 4A to 4G are cross-sectional views schematically showing a sequence of steps involved in the manufacture of the photoelectric conversion device of the embodiment of the present invention depicted in FIGS. 1 to 3.

The manufacturing method of the photoelectric conversion device shown in FIGS. 4A to 4H is as follows:

The manufacture starts with the preparation of a substrate 1 such as described previously with respect to FIGS. 1 to 3, as shown in FIG. 4A.

Figure 4B:
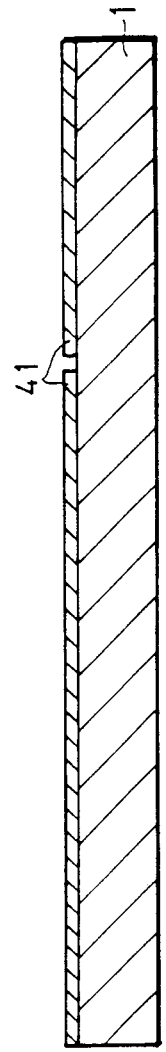

Then, as shown in FIG. 4B, the conductive layer 41 which will ultimately form the electrodes $E_a$, $E_1$ to $E_n$ and $E_b$ described previously in connection with FIGS. 1 and 2 is formed on the substrate 1 by a known method.

In the case where the electrodes $E_a$, $E_1$ to $E_n$ and $E_b$ are each formed to have the two-layer structure as described previously, the conductive layer 41 is made up of two layers. The first layer is first formed on the substrate 1 by a known method, for example, vapor deposition and then the second layer is similarly formed thereon by a known method, for instance, vapor deposition.

Figure 4C:
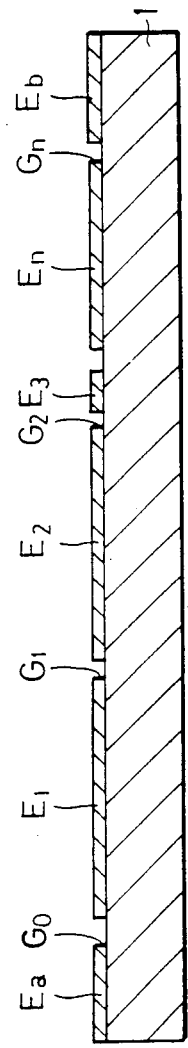

Next, the conductive layer 41 is irradiated by a laser beam (not shown) having a diameter of 30 to 70 $\mu$m, typically, 40 $\mu$m, by which the aforementioned (n−1) grooves $G_0$ and $G_1$ to $G_{n-1}$ are cut in the conductive layer 41 to form n electrodes $E_a$, $E_1$ to $E_n$ and $E_b$ which are separated from adjacent ones of them by the grooves $G_1$ to $G_n$, as shown in FIG. 4C. For irradiation of the laser beam, it is possible to employ a laser beam of a 1.06 $\mu$m wavelength from a YAG laser and a laser beam of a 0.488 or 0.512 $\mu$m wavelength from an argon laser.

The abovesaid irradiation of the laser beam can be carried out in the air but may also be performed in an atmosphere of a gas which reacts with the conductive material of the layer 41 at high temperatures to sputter it from the substrate surface. In this case, the gas used may be hydrogen fluoride (HF), hydrogen chloride (HCl) or Freon gas ($CF_4$, $CHF_3$, $CClF_3$ and like gases).

In the case where the irradiation of the laser beam scanning takes place in the air, burrs are likely to form on the upper marginal edges of the grooves $G_0$ and $G_1$ to $G_n$. Accordingly, it is desirable that the irradiation of the laser beam be followed by deburring through the use of the abovesaid gas or etching with an etchant such as hydro fluoric acid (HF), hydrochloric acid (HCl) or Freon liquids ($C_2F_3Cl_4$) and similar liquids.

Moreover, it is possible to accomplish the irradiation of the laser beam of the conductive layer 41 easily and accurately by the aid of a computer while monitoring through a video camera device.

Figure 4D:
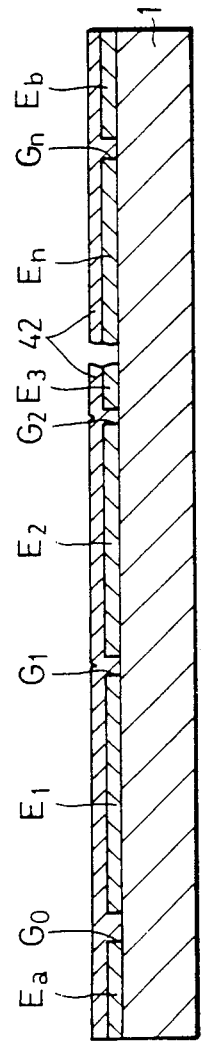

Next, a non-single-crystal semiconductor layer 42 is formed on the substrate by a known method, for example, low-pressure CVD to fill the grooves $G_0$ and $G_1$ to $G_n$ and to cover the electrodes $E_n$, $E_1$ to $E_n$ and $E_b$ as shown in FIG. 4D so that the regions of the layer 42 on the electrodes $E_1$ to $E_n$ may be the non-single-crystal semiconductor laminate members $Q_1$ to $Q_n$ described previously in respect of FIGS. 1 to 3.

Where the non-single-crystal semiconductor laminate members $Q_1$ to $Q_n$ are each formed as the three-layer structure consisting of the non-single-crystal semiconductor layers 8, 9, and 10 as described previously with regard to FIG. 3, non-single-crystal semiconductor layers which will ultimately be used as the non-single-crystal layers 8, 9, and 10 respectively, are formed in this order through the use of a known method, for instance, the low-pressure CVD method, thereby providing the non-single-crystal semiconductor laminate member 42.

Figure 4E:
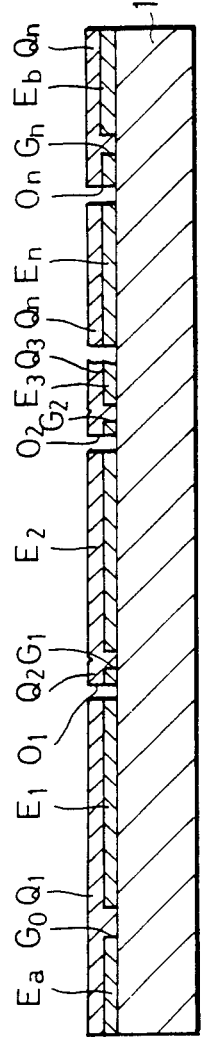

After this, the non-single-crystal semiconductor laminate members $Q_1$ to $Q_n$ are selectively removed by using a laser beam to cut therein the aforementioned n second grooves $O_1$ to $O_n$ as shown in FIG. 4E.

In this case, the groove $O_i$ (i=1, 2, . . . n) can be formed to extend down to the insulating film of the substrate 1 across the electrode $E_i$ as illustrated. The irradiation of the laser beam of the non-single-crystal semiconductor laminate members $Q_1$ to $Q_n$ can take place in the air as is the case with the conductive layer 41. It is also possible to carry out the irradiation of the laser beam scanning in the atmosphere of a gas which reacts with the materials of the non-single-crystal semiconductor laminate member 42 and the electrodes $E_a$, $E_1$ to $E_n$ and $E_b$ at high temperatures to sputter them from the substrate surface 1. Also in this case, the gas used is hydrogen fluoride, hydrogen chloride, or Freon gas.

In the case where the irradiation of the laser beam of the non-single-crystal semiconductor laminate members $Q_1$ to $Q_n$ is carried out in the air, it is desirable that the irradiation of the laser beam be followed by deburring through the use of the aforesaid gas or etching with such etchants as mentioned previously.

The abovesaid irradiation of the laser beam can also be performed easily and accurately by the aid of a computer while monitoring through a video camera device.

The groove $O_j$ (j=1, 2, . . . (n−1)) is formed at a position spaced a predetermined distance apart from the groove $G_j$ laterally therefrom (on the left thereof in FIG. 4). The abovesaid predetermined distance is large as compared with the thickness of the non-single-crystal semiconductor laminate member 42. It is preferable, however, to minimize this distance. By the aid of a computer the groove $O_j$ can be provided in close proximity to the groove $G_j$ with high accuracy. This permits reduction of the area of the substrate 1 occupied by the region 14 of the electrode $E_j$.

Figure 4F:
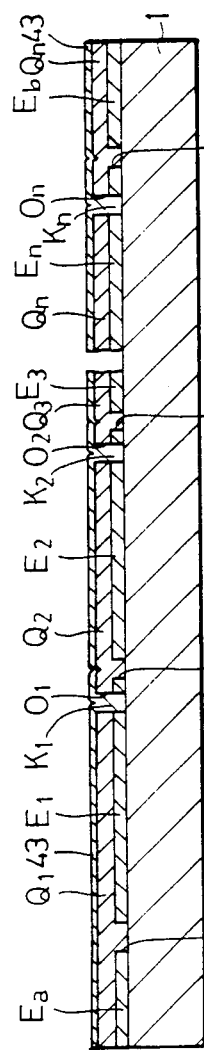
Figure 4G:
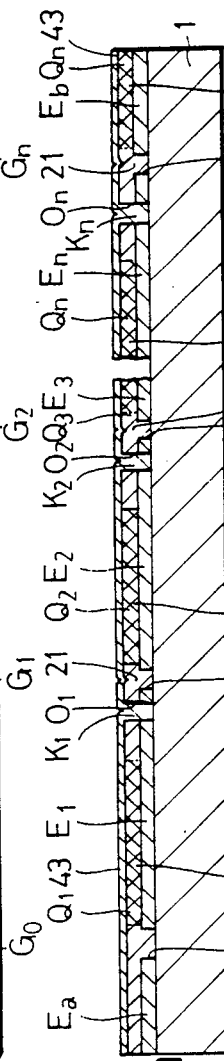

Next, as shown in FIG. 4F, a conductive layer 43, which will ultimately form the electrodes $F_1$ to $F_n$ and $F_0$ referred to with respect to FIGS. 1 to 3, is formed, for example, by vapor deposition so as to cover the non-single-crystal semiconductor laminate members $Q_1$ to $Q_n$ and to fill the grooves $O_1$ to $O_n$, forming coupling portions $K_1$ to $K_n$.

Figure 4H:
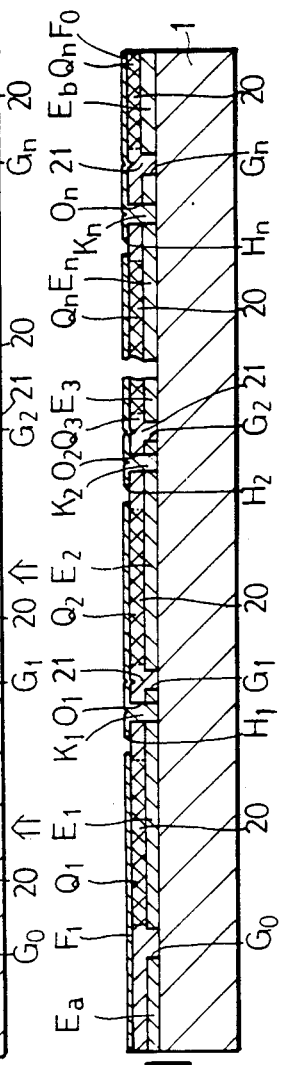

Next, as shown in FIG. 4H, the conductive layer 43 is selectively removed by using a laser beam as is the case with the conductive layer 41. By this irradiation of the laser beam there are formed in the conductive layer 43 n isolating portions $H_1$ to $H_n$, electrodes $F_1$ to $F_n$ and $F_0$ separated by the isolating portions $H_1$ to $H_n$, respectively, and opposite to the electrodes $E_1$ to $E_n$ across the non-single-crystal semiconductor laminate members $Q_1$ to $Q_n$, respectively. In this case, the irradiation of the laser beam is carried out so that the electrode $F_{j+1}$ may be linked with the electrode $E_j$ through the coupling portion $K_j$ and so that the electrode $F_0$ may be linked with the electrode $E_n$ through the coupling portion $K_n$.

By the abovesaid irradiation of the laser beam the isolating portion $H_i$ (i=1, 2, . . . n) can be formed to extend into the non-single-crystal semiconductor laminate member $Q_i$.

As is the case with the conductive layer 41, the laser beam scanning of the conductive layer 43 can be effected in the air and may also be carried out in the atmosphere of a gas which reacts with the materials of the conductive layer 43 and the non-single-crystal semiconductor laminate members $Q_1$ to $Q_n$ at high temperatures to sputter them from the substrate surface. The gas used in this case may be hydrogen fluoride, hydrogen chloride, or Freon gas.

Also in the case of performing the irradiation of the laser beam on the conductive layer 43 in the air, it is desirable that the irradiation of the laser beam be followed by deburring through the use of the aforesaid gas or etching using the aforesaid liquid as the etchant.

By the irradiation of the laser beam for segmenting the conductive layer 43, the isolating portion $H_i$ can be provided in the form of a groove as illustrated.

The irradiation of the laser beam of the conductive layer 43 can also be carried out easily and accurately by the aid of a computer while monitoring through a video camera device.

Further, the isolating portion $H_i$ is formed a predetermined distance from the groove $O_i$ laterally therefrom (on the left thereof in the drawing). The abovesaid predetermined distance is large as compared with the thickness of the non-single-crystal semiconductor laminate member 43, but it may preferably be selected as small as possible. By the aid of a computer the isolating portion $H_i$ can be formed in close proximity to the groove $O_i$ with high precision.

Before or after the formation of the isolating portion $H_j$, the portion 20 described previously in connection with FIGS. 1 to 3 is formed in the laminate member $Q_j$. In FIG. 4, the portion 20 is shown to be formed before the formation of the isolating portion $H_j$. Where the substrate 1 and the first electrode $E_i$ are transparent, the portion 20 is formed by irradiating the laminate member $Q_j$ locally with light of a wavelength greater than 500 nm from the side of the substrate 1. The irradiation by light takes place through the conductive layer 43 when it is transparent. For this irradiation, a continuous YAG laser beam (500 nm in wavelength) and an intermittent YAG laser beam can be employed.

Where the laminate member $Q_i$ is formed of an amorphous semiconductor before the light irradiation, the amorphous semiconductor of the portion 20 is rendered by the light irradiation into microcrystalline or polycrystalline form. Accordingly, the portion 20 is formed of a microcrystalline or polycrystalline semiconductor, and the portion 21 is formed of an amorphous semiconductor. In the event that the laminate member $Q_i$ is microcrystalline or polycrystalline before the light irradiation, the portion 20 is formed of a microcrystalline or polycrystalline semiconductor larger in grain size than the portion 21.

After the formation of the portion 20, a transparent antireflection and protective film 15 is formed by a known method on the substrate to cover the electrodes $F_1$ to $F_n$ and $F_0$ and the isolating portions $H_1$ to $H_n$ as shown in FIG. 2.

In the manner described above, the photoelectric conversion device of the present invention, shown in FIGS. 1 and 2, is manufactured.

The above is a description of an embodiment of the present invention and an example of its manufacturing method.

According to the photoelectric conversion device of FIGS. 1 and 2, when light (not shown) is incident thereon from the side of the substrate 1 or the electrodes $F_1$ to $F_n$, each semiconductor elements $U_i$ (i=1, 2, . . . n) performs photoelectric conversion to generate photovoltage across its electrodes $E_i$ and $F_i$.

The electrode $F_{j+1}$ (j=1, 2, . . . (n−1)) of the semiconductor element $U_{j+1}$ is linked with the electrode $E_j$ of the semiconductor element $U_j$ through the coupling portion $K_j$ and the electrode $F_1$ of the semiconductor element $U_1$ is connected to an external connection terminal 11 and the electrode $E_n$ of the semiconductor element $U_n$ is connected to an external connection terminal 12 through the coupling portion $K_n$ and the electrode $F_0$.

Accordingly, the semiconductor elements $U_1$ to $U_n$ are sequentially connected in series through the coupling portions $K_1$ to $K_{n-1}$ and connected to the external connection terminals 11 and 12. Consequently, upon incidence of light, there is developed across the external connection terminals 11 and 12 the photovoltage that is equal to the sum of voltages produced by the semiconductor elements $U_1$ to $U_n$.

A description will be given of other embodiments of the photoelectric conversion device of the present invention.

In the embodiment of the photoelectric conversion device of the present invention depicted in FIGS. 1 to 3, the groove $O_j$ extends across the electrode $E_j$ to reach the substrate 1, and the coupling portion $K_j$ makes contact only with the side of the electrode $E_j$ exposed to the groove $O_j$.

In another embodiment of the photoelectric conversion device of the present invention, however, the groove $O_j$ is not extended into the electrode $E_j$ and the coupling portion $K_j$ is formed to make contact only with the top of the electrode $E_j$ exposed to the groove $O_j$.

Further, according to another embodiment, the width of the groove $O_j$ in the electrode $E_j$ is made smaller than in the non-single-crystal semiconductor laminate member $Q_j$ and the coupling portion $K_j$ is formed to make contact with the top and side of the electrode $E_j$ exposed to the groove $O_j$.

Moreover, according to another embodiment, the groove $O_j$ is extended into the substrate 1 with a greater width than in the electrode $E_j$, and the coupling portion $K_j$ is formed to make contact with the side and bottom of the electrode $E_j$ exposed to the groove $O_j$.

According to another embodiment, the groove $O_j$ is extended across the electrode $E_j$ and into the substrate 1, and the coupling portion $K_j$ is formed to make contact with the top, side, and bottom of the electrode $E_j$ exposed to the groove $O_j$.

In the embodiment of the photoelectric conversion device shown in FIGS. 1 to 3, the electrodes $F_j$ and $F_{j+1}$ of the semiconductor elements $U_j$ and $U_{j+1}$ are isolated by the isolating portion provided in the form of a groove and the isolating portion $H_j$ does not extend into the non-single-crystal semiconductor laminate member $Q_i$. In another embodiment of the photoelectric conversion device, the isolating portion $H_j$ extends across the non-single-crystal semiconductor laminate member $Q_i$.

Further, according to another embodiment of the photoelectric conversion device, the isolating portion $H_j$ consists of the groove defined between the electrodes $F_j$ and $F_{j+1}$ and the oxide of the non-single-crystal semiconductor forming the non-single-crystal semiconductor laminate member $Q_j$, which is formed in the upper half portion thereof.

Such isolating portions $H_1$ to $H_n$ can easily be formed by carrying out in an oxygen atmosphere the irradiation of the laser beam for the conductive layer 43 described previously with respect to FIG. 4.

Moreover, according to another embodiment of the photoelectric conversion device the isolating portion $H_j$ is formed by an oxide which results from oxidation of the conductive material forming the electrodes $F_j$ and $F_{j+1}$ and separates them. Such isolating portions $H_1$ to $H_n$ can easily be formed by the irradiation of the same laser beam as that employed for abovesaid embodiment.

According to another embodiment of the photoelectric conversion device, the isolating portion $H_j$ is formed by a groove which barely extends into the non-single crystal semiconductor laminate member $Q_j$ but separates the electrodes $E_j$ and $E_{j+1}$ as shown. Such isolating portion $H_1$ to $H_n$ can easily be formed by adjusting the power of the laser beam.

Further according to another embodiment of the photoelectric conversion device, the isolating portion $H_j$ has such a structure that an oxide layer is formed on the interior surface of the groove described previously with respect to FIG. 3. Such an isolating portion $H_j$ can easily be formed by performing the irradiation of the laser beam for the conductive layer 43 mentioned previously with regard to FIG. 4 in an oxygen atmosphere.

While in the foregoing embodiments of the present invention the groove $O_j$ formed in the non-single-crystal semiconductor laminate members $Q_j$ is shown to be a groove which completely isolates the non-single-crystal semiconductor laminate members $Q_j$ and $Q_{j+1}$ mechanically, the groove $O_j$ may also be formed so that the non-single-crystal semiconductor laminate members $Q_j$ and $Q_{j+1}$ may not be completely isolated by the groove $O_j$ from each other.

It will be apparent that may modifications and variations may be effected without departing from the scope of the novel concepts of the present invention.

What is claimed is:

1. A method of making a photoelectric conversion device in which a plurality n (where n is an integer layer than 2) of semiconductor elements $U_1$ to $U_n$ are sequentially formed side by side on a substrate having an insulating surface and connected in series one after another, the semiconductor element $U_i (i=1, 2, \ldots n)$ comprising a first electrode $E_i$ on the substrate, a non-single-crystal semiconductor laminate member $Q_i$ on the first electrode $E_i$ and a second electrode $F_i$ on the non-single-crystal semiconductor laminate member $Q_i$, the second electrode $F_{j+1}$ of the semiconductor element $U_{j+1}$ $(j=1, 2, \ldots (n-1))$ being connected via coupling portion $K_j$ to the first electrode $E_j$, comprising the steps of:

forming on the substrate a first conductive layer;

forming $(n-1)$ sequentially arranged first grooves $G_1$ to $G_{n-1}$ in the first conductive layer by using a first laser beam to form therein n sequentially arranged first electrodes $E_1$ to $E_n$ separated by the first grooves $G_1$ to $G_{n-1}$, respectively;

forming on the substrate a non-single-crystal semiconductor laminate layer to cover the first grooves $G_1$ to $G_{n-1}$ and the first electrodes $E_1$ to $E_n$, the non-single-crystal semiconductor laminate layer having at least a first non-single-crystal semiconductor layer having a P or N conductivity type, a second non-single-crystal semiconductor layer having I conductivity and a third non-single-crystal semiconductor layer having opposite conductivity type to the first non-single-crystal semiconductor layer;

forming $(n-1)$ sequentially arranged grooves $O_1$ to $O_{n-1}$ in the non-single-crystal semiconductor laminate layer by using a second laser beam to form n sequentially arranged non-single-crystal semiconductor laminate member $Q_1$ to $Q_n$ extending on the first electrode $E_1$ to $E_n$, respectively and to expose the first electrode $E_1$ to $E_{n-1}$ to the outside through the grooves $O_1$ to $O_{n-1}$, respectively;

forming a second conductive layer comprising a conductive metal oxide layer and which continuously extends on the non-single-crystal semiconductor laminate members $Q_1$ to $Q_n$ and extends into the grooves $O_1$ to $O_{n-1}$ to provide coupling portions $K_1$ to $K_{n-1}$ which are connected to the first electrodes $E_1$ to $E_{n-1}$ through the grooves $O_1$ to $O_{n-1}$, respectively; and forming $(n-1)$ sequentially arranged isolating portions $H_1$ to $H_{n-1}$ in at least the second conductive layer to form n sequentially arranged second electrodes $F_1$ to $F_n$ separated by the isolating portions $H_1$ to $H_{n-1}$ and opposing the first electrode electrode $E_1$ to $E_{n-1}$ through the isolating portion $H_1$ to $H_{n-1}$, respectively, the second electrode $F_{j+1}$ being connected to the first electrode $E_j$ through the coupling portion $K_j$ by the contact between the conductive metal oxide layer of the coupling portion $K_j$ and the first conductive layer of the first electrode $E_j$; and before or after the formation of the isolating portions $H_1$ to $H_{n-1}$ selectively for annealing by light having a wavelength greater than 500 nm to the region between the first electrode $E_i$ and the second electrode $F_i$ of the non-single-crystal semiconductor laminate member $Q_i$.

* * * * *